(12) United States Patent
Lee

(10) Patent No.: US 9,653,130 B1
(45) Date of Patent: May 16, 2017

(54) LATENCY CONTROL DEVICE AND SEMICONDUCTOR DEVICE INCLUDING THE SAME

(71) Applicant: SK hynix Inc., Icheon-si Gyeonggi-do (KR)

(72) Inventor: Seong Jun Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/189,214

(22) Filed: Jun. 22, 2016

(30) Foreign Application Priority Data

Mar. 17, 2016 (KR) .......................... 10-2016-0032362

(51) Int. Cl.
*G11C 7/22* (2006.01)
*G11C 7/10* (2006.01)
*G11C 11/4076* (2006.01)

(52) U.S. Cl.
CPC .............. *G11C 7/222* (2013.01); *G11C 7/106* (2013.01); *G11C 7/1057* (2013.01); *G11C 7/109* (2013.01); *G11C 7/1066* (2013.01); *G11C 7/22* (2013.01); *G11C 2207/2272* (2013.01)

(58) Field of Classification Search
CPC ... G11C 7/222; G11C 7/22; G11C 2207/2272; G11C 7/109; G11C 7/1066
USPC .......................... 365/191, 194, 233.1, 233.11
See application file for complete search history.

(56) References Cited

U.S. PATENT DOCUMENTS

| 8,867,301 | B2* | 10/2014 | Shido ....................... G11C 8/10 365/194 |
| 8,953,392 | B2 | 2/2015 | Kim |
| 2003/0174575 | A1* | 9/2003 | Kono ................... G11C 7/1066 365/233.1 |
| 2007/0257717 | A1* | 11/2007 | Yoon .................... G06F 13/4226 327/153 |
| 2008/0192563 | A1* | 8/2008 | Cho ......................... G11C 7/22 365/233.17 |
| 2009/0175092 | A1* | 7/2009 | Cho ..................... G11C 7/1051 365/189.05 |
| 2015/0003171 | A1 | 1/2015 | Kim et al. |

* cited by examiner

*Primary Examiner* — Ly D Pham
(74) *Attorney, Agent, or Firm* — William Park & Associates Ltd.

(57) ABSTRACT

A latency control device and a semiconductor device including the same may be provided. The latency control device may include a first delay controller configured to delay a command signal based on a first internal clock having a first phase and a control signal. The latency control device may include a second delay controller configured to delay the command signal based on a second internal clock having a second phase different from the first phase and a test control signal. The latency control device may include a selection circuit configured to select any one of an output signal of the first delay controller and an output signal of the second delay controller based on a selection signal, and output a latency signal. The latency control device may include a test controller configured to generate the test control signal based on the control signal and a test signal.

10 Claims, 9 Drawing Sheets

LATENCY CONTROL DEVICE AND SEMICONDUCTOR DEVICE INCLUDING THE SAME

CROSS-REFERENCE TO RELATED APPLICATION

This application claims priority based upon Korean patent application No. 10-2016-0032362, filed on Mar. 17, 2016, the disclosure of which is hereby incorporated in its entirety by reference herein.

BACKGROUND

1. Technical Field

Embodiments of the present disclosure may generally relate to a latency control device and a semiconductor device including the same, and more particularly to a technology for testing a latency operation of the semiconductor device.

2. Related Art

With increasing integration of semiconductor memory devices, operation speeds of the semiconductor memory devices have also been continuously improved. In order to increase operation speeds of semiconductor memory devices, synchronous memory devices capable of operating by synchronizing with an external clock of a memory chip have recently been proposed.

A representative example of a synchronous memory device is a single data rate (SDR) synchronous memory device that is synchronized with a rising edge of an external clock of a memory device such that one data piece can be input and/or output at one data pin during one period of the clock.

However, the SDR synchronous memory device has difficulty in satisfying high-speed system operations. In order to solve this, a double data rate (DDR) synchronous memory device capable of processing two pieces of data during one clock period has been proposed.

Two contiguous pieces of data are input and output through respective data input/output (I/O) pins of the DDR synchronous memory device, such that the two contiguous pieces of data are synchronized with a rising edge and a falling edge of an external input clock. Therefore, although a clock frequency of the DDR synchronous memory device is not increased, the DDR synchronous memory device may have a bandwidth that is at least two times larger than that of the SDR synchronous memory device, such that the DDR synchronous memory device can operate at a higher speed than the SDR synchronous memory device.

The DDR synchronous memory device should transmit or receive two pieces of data within one clock period. However, it is impossible for the DDR synchronous memory device to effectively perform the above transmission/reception operation using a conventional data access scheme for use in a conventional synchronous memory device. Therefore, a new data access scheme is needed, which can receive data from the memory device and transmit the received data to an internal region, and can also transmit data received from a core region to an external part.

SUMMARY

In accordance with an embodiment of the present disclosure, a latency control device may be provided. The latency control device may include a first delay controller configured to delay a command signal based on a first internal clock having a first phase and a control signal. The latency control device may include a second delay controller configured to delay the command signal based on a second internal clock having a second phase different from the first phase and a test control signal. The latency control device may include a selection circuit configured to select any one of an output signal of the first delay controller and an output signal of the second delay controller based on a selection signal, and output a latency signal. The latency control device may include a test controller configured to generate the test control signal based on the control signal and a test signal.

In accordance with an embodiment of the present disclosure, a semiconductor device may be provided. The semiconductor device may include a buffer configured to buffer an external clock. The semiconductor device may include a divider configured to divide an output clock of the buffer, and generate a first internal clock having a first phase and a second internal clock having a second phase different from the first phase. The semiconductor device may include a latency control device configured to control a latency signal based on the first internal clock, the second internal clock, a command signal, a control signal, and a test signal, and reset any one of the first internal clock and the second internal clock based on the activation of the test signal. The semiconductor device may include a delay locked loop (DLL) circuit configured to output data by delaying the latency signal.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a latency control device and a semiconductor device including the same that substantially obviates one or more problems due to limitations and disadvantages of the related.

An embodiment of the present disclosure may relate to a technology for outputting a latency signal by extracting only a rising or falling edge in response to a test signal, thereby testing a latency operation of a semiconductor device.

Figure 1:
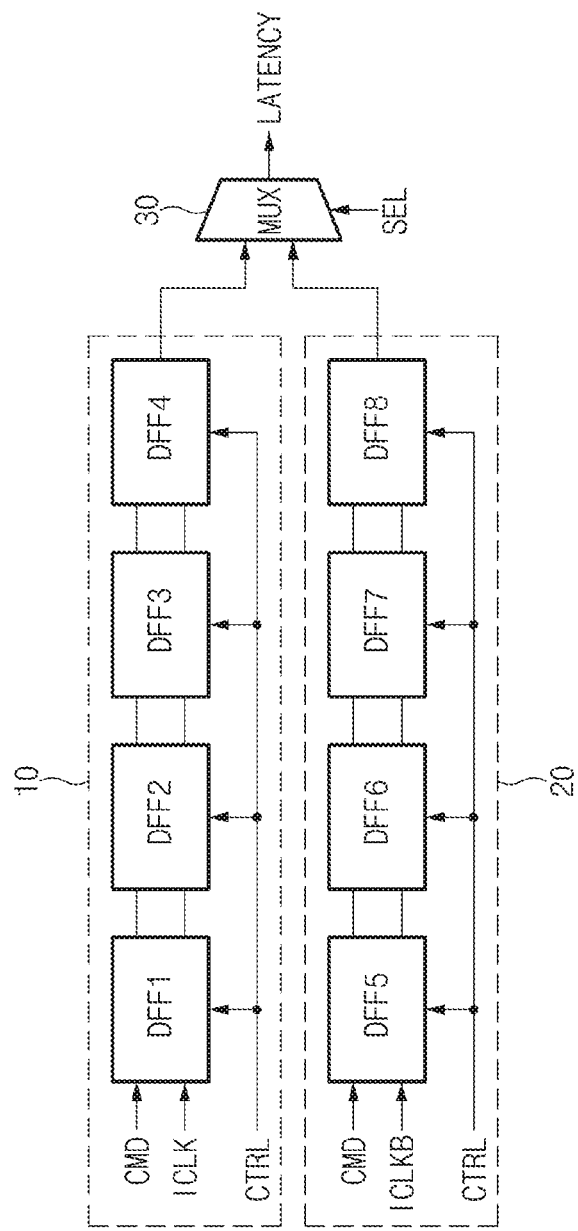
FIG. 1 is a block diagram illustrating a representation of an example of a latency control device according to an embodiment of the present disclosure.

FIG. 1 is a block diagram illustrating a representation of an example of a latency control device according to an embodiment of the present disclosure.

Referring to FIG. 1, the latency control device may include a first delay controller 10, a second delay controller 20, and a selection circuit 30. The first delay controller 10 may delay a command signal CMD in response to a control signal CTRL and a first internal clock ICLK, and may then output data. The second delay controller 20 may delay a command signal CMD in response to a control signal CTRL and a second internal clock ICLKB, and may then output data.

The first internal clock ICLK may have a phase different to that of the second internal clock ICLKB. The first internal clock ICLK may have a phase opposite to that of the second internal clock ICLKB. For example, assuming that the first internal clock ICLK is the rising clock, the second internal clock ICLKB may be the falling clock.

The first delay controller 10 may include a plurality of flip-flops (DFF1~DFF4) coupled in series. Upon receiving a command signal CMD, the plurality of flip-flops (DFF1~DFF4) may sequentially flip-flop the first internal clock ICLK in response to the control signal CTRL. Each of the plurality of flip-flops (DFF1~DFF4) may include, for example, a D flip-flop.

The second delay controller 20 may include a plurality of flip-flops (DFF5~DFF8) coupled in series. Upon receiving the command signal CMD, the plurality of flip-flops (DFF5~DFF8) may sequentially flip-flop the second internal clock ICLKB in response to the control signal CTRL. Each of the flip-flops (DFF5~DFF8) may include, for example, a D flip-flop.

The selection circuit 30 may select any one of the output signal of the first delay controller 10 and the output signal of the second delay controller 20 in response to a selection signal SEL, and may thus output a latency signal LATENCY. The selection signal SEL receives clock information, and may be used to determine whether the output signal of the first delay controller 10 will be selected or the output signal of the second delay controller 20 will be selected. The selection circuit 30 may include a multiplexer (MUX) configured to select any one of two signals in response to the selection signal SEL.

Figure 2:
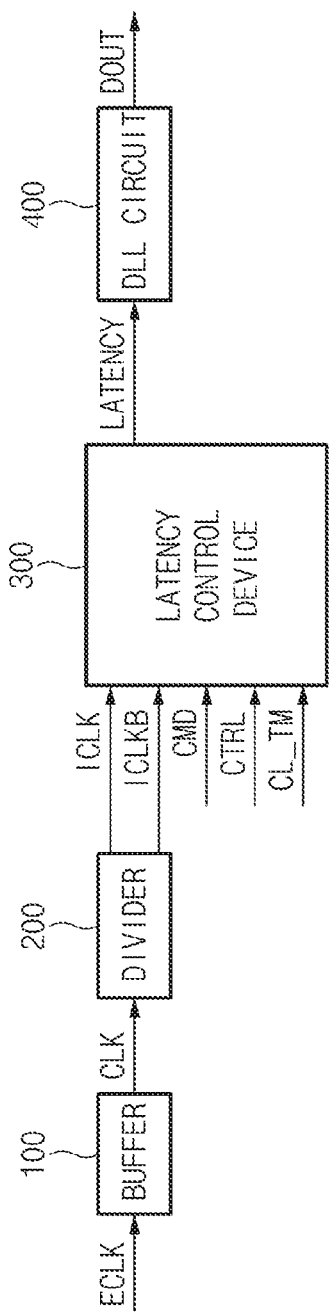
FIG. 2 is a block diagram illustrating a representation of an example of a semiconductor device according to an embodiment of the present disclosure.

FIG. 2 is a block diagram illustrating a representation of an example of a semiconductor device according to an embodiment of the present disclosure.

Referring to FIG. 2, the semiconductor device according to an embodiment may include a buffer 100, a divider 200, a latency control device 300, and a DLL circuit 400.

The buffer 100 may generate a clock CLK by buffering an external clock ECLK. The divider 200 may divide the clock CLK, and thus generate a first internal clock ICLK having the rising edge and a second internal clock ICLKB having the falling edge. The first internal clock ICLK may have a phase opposite to that of the second internal clock ICLKB.

The latency control device 300 may generate a latency signal LATENCY in response to the first internal clock ICLK, the second internal clock ICLKB, the command signal CMD, the control signal CTRL, and a test signal CL_TM. Structure and operations of the latency control device 300 will hereinafter be described with reference to FIG. 3.

A Delay Locked Loop (DLL) circuit 400 may delay the latency signal LATENCY for a predetermined time, and then output an output signal DOUT. For convenience of description, an embodiment of the present disclosure has, for example, disclosed that the latency control device 300 is located prior to the DLL circuit 400. However, the scopes or spirits of the embodiments of the present disclosure are not limited thereto, and it should be noted that the latency control device 300 may also be contained in an output stage of the DLL circuit 400 as necessary.

The synchronous memory device uses some concepts different from those of a conventional asynchronous memory device. A representative example of such concepts is referred to as a column access strobe (CAS) latency. The CAS latency (CL) may refer to the number of clock signals generated for a predetermined time in which a read command is first input and the memory device outputs data. For example, "CL=3" may indicate that a read command is first input to the memory device and the resultant data is then output externally after a lapse of three clock periods.

Therefore, the CAS latency (CL) mode value may determine a timing point at which data is output. The memory device may detect a set CAS latency (CL) value during initial operation, and may use the set CL value for accessing and outputting data. A data output enable signal may be generated by delaying a signal generated in response to a read command during an operation clock period corresponding to the set CAS latency (CL) value. Thereafter, the data output enable signal should be activated or enabled in a manner that data accessed in response to the read command can be output externally.

In this case, the used operation clock is a DLL clock of the DLL circuit 400 for delay-locking a clock signal received from the external part for a predetermined time. The DLL clock may be generated by a delay locked loop (DLL), and then output. The memory device should be correctly synchronized with the rising edge and the falling edge of the clock received from the external part, prior to outputting data.

However, due to the occurrence of a delay time of a clock signal inevitably generated in the internal processing stage, the memory device cannot be correctly synchronized with the rising edge and the falling edge of the external clock such that it is unable to output data. In order to address the above-mentioned issue, a clock signal is generated, and this clock signal is referred to as a DLL clock generated from a delay locked loop (DLL) of the memory device. If data is synchronized with the DLL clock and then output to the external part, the data may be synchronized with the rising edge and the falling edge of the external clock such that the synchronized data is then output.

That is, a clock signal for use in the system or circuit has been used as a reference for establishing the operation time point, and has also been used to guarantee reliability of higher-speed operations without errors. When the external input clock signal is used in the internal circuit, a time delay (clock skew) caused by the internal circuit occurs.

In order to allow the internal clock to have the same phase as that of the external clock through compensation of such time delay (clock skew), the DLL circuit 400 is used. That is, the DLL circuit 400 may allow a data output time point, at which data sensed through the external clock is output after passing through the data output buffer, to be identical to a time point of the external input clock signal.

Figure 3:
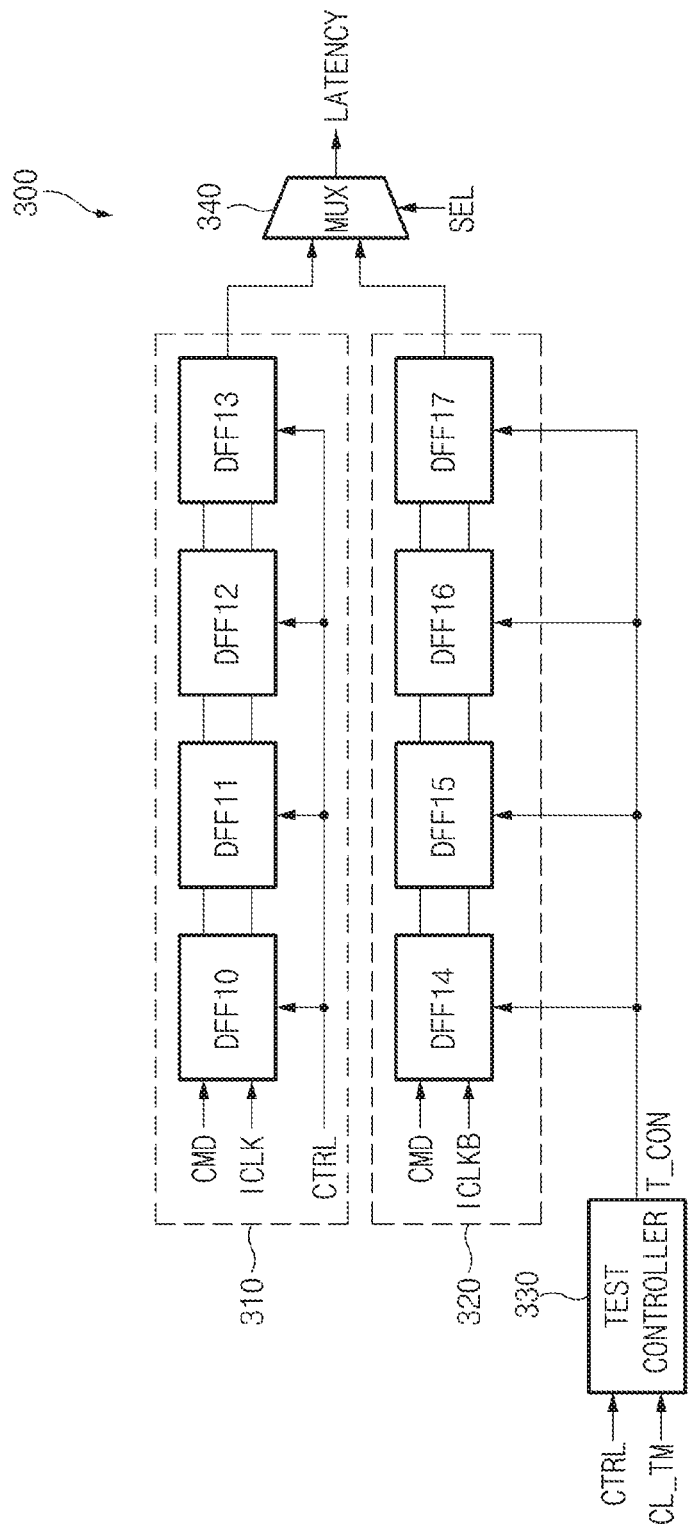
FIG. 3 is a block diagram illustrating a representation of an example of a latency control device according to an embodiment of the present disclosure.

FIG. 3 is a block diagram illustrating a representation of an example of a latency control device according to an embodiment of the present disclosure. The latency control device illustrated in FIG. 3 may correspond to the latency control device 300 illustrated in FIG. 2.

Referring to FIG. 3, the latency control device 300 may include a first delay controller 310, a second delay controller 320, a test controller 330, and a selection circuit 340. The first delay controller 310 may delay a command signal CMD in response to a control signal CTRL and a first internal clock ICLK, and may then output data. The second delay controller 320 may delay a command signal CMD in response to a test control signal T_CON and a second internal clock ICLKB, and may then output data.

The first internal clock ICLK may have a phase different to that of the second internal clock ICLKB. For example, the first internal clock ICLK may have a phase opposite to that of the second internal clock ICLKB. For example, assuming that the first internal clock ICLK is the rising clock, the second internal clock ICLKB may be identical to the falling clock.

The first delay controller 310 may include a plurality of flip-flops (DFF10~DFF13) coupled in series. Upon receiving a command signal CMD, the plurality of flip-flops (DFF10~DFF13) may sequentially flip-flop the first internal clock ICLK in response to the control signal CTRL. Each of the plurality of flip-flops (DFF10~DFF13) may include, for example, a D flip-flop.

The second delay controller 320 may include a plurality of flip-flops (DFF14~DFF17) coupled in series. Upon receiving the command signal CMD, the plurality of flip-flops (DFF14~DFF17) may sequentially flip-flop the second internal clock ICLKB in response to the test control signal T_CON. Each of the flip-flops (DFF14~DFF17) may include, for example, a D flip-flop.

The test controller 330 may output the test control signal T_CON to the second delay controller 320 in response to the control signal CTRL and the test signal CL_TM. The test controller 330 may activate the test control signal T_CON when a test signal CL_TM is activated. In this case, the second delay controller 320 may reset the falling edge of the second internal clock ICLKB by the test control signal T_CON, and then output the reset result.

If the test signal CL_TM is deactivated, the test controller 330 may control the second delay controller 320 by the test control signal T_CON corresponding to the control signal CTRL.

The selection circuit 340 may select any one of the output signal of the first delay controller 310 and the output signal of the second delay controller 320 in response to the selection signal SEL, and may then output a latency signal LATENCY. The selection signal SEL receives clock information, and may be used to determine whether the output signal of the first delay controller 310 will be selected or the output signal of the second delay controller 320 will be selected. The selection circuit 340 may include a multiplexer (MUX) configured to select any one of two signals in response to the selection signal SEL.

During the initial operation of the semiconductor device, after lapse of a power-up time corresponding to a stabilization time, various commands (e.g., a CAS latency (CL) command, an additive latency command, a reset command of the DLL circuit 400, etc.) may be applied to the semiconductor device by a Mode Register Set (MRS).

In this case, the CAS latency (CL) value may be predetermined by the mode register set (MRS). Thereafter, if the read command is applied to the semiconductor device, data is delayed by a predetermined time corresponding to the CAS latency (CL) value, and the resultant data is then output.

However, if the divided clock is used, the read signal may be synchronized with the rising edge or the falling edge of the divided clock. The CAS latency (CL) operation is an internal operation of the semiconductor device, such that it may be impossible for a user who is located outside of the semiconductor device to recognize whether the CAS latency (CL) is synchronized with the rising edge or the falling edge.

Therefore, the semiconductor device according to an embodiment of the present disclosure resets the falling edge (or odd information) other than the rising edge (or even information) when the test control signal T_CON is activated, such that the user who is located outside of the semiconductor device can recognize an internal function of the semiconductor device.

Although an embodiment has, for example, disclosed that the second delay controller 320 is reset by the test control signal T_CON for convenience of description and better understanding of the present disclosure, the scope or spirit of the present disclosure is not limited thereto, the embodiments may also reset the rising edge by resetting the first delay controller 310.

Figure 4:
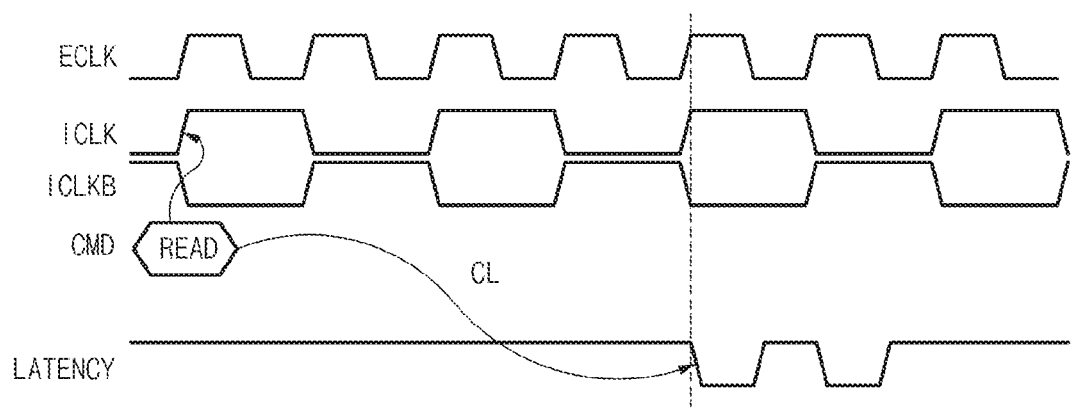
FIGS. 4 and 5 are timing diagrams illustrating representations of examples of the operation of the latency control device illustrated in FIG. 1.
Figure 5:
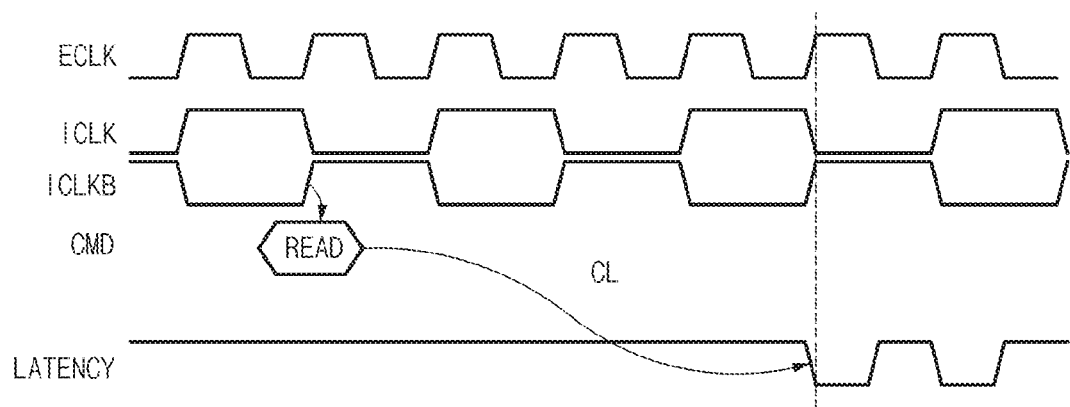

FIGS. 4 and 5 are timing diagrams illustrating representations of examples of the operation of the latency control device illustrated in FIG. 1.

Upon receiving the external clock ECLK, the received external clock ECLK is divided by a half frequency such that the first internal clock ICLK and the second internal clock ICLKB are generated.

The read command READ is synchronized with the rising edge of the first internal clock ICLK and then applied to the latency control device as illustrated in FIG. 4. After lapse of a delay time corresponding to the CAS latency (CL) established in the latency control device 300, the latency control device 300 may output the latency signal LATENCY.

For example, the read command READ is synchronized with the rising edge of the second internal clock ICLKB and then applied to the latency control device as illustrated in FIG. 5. After lapse of a delay time corresponding to the CAS latency (CL) established in the latency control device 300, the latency control device 300 may output the latency signal LATENCY. In this case, the latency signal LATENCY illustrated in FIG. 5 may be configured to lag the latency signal LATENCY illustrated in FIG. 4, such that the latency signal LATENCY of FIG. 4 is output earlier than the latency signal LATENCY of FIG. 5.

In the case of using the divided clocks, the rising clock and the falling clock may be different in margin from each other due to skew of clocks and skew of command signals. In this case, a process for calculating an optimum time point is needed.

Figure 6:
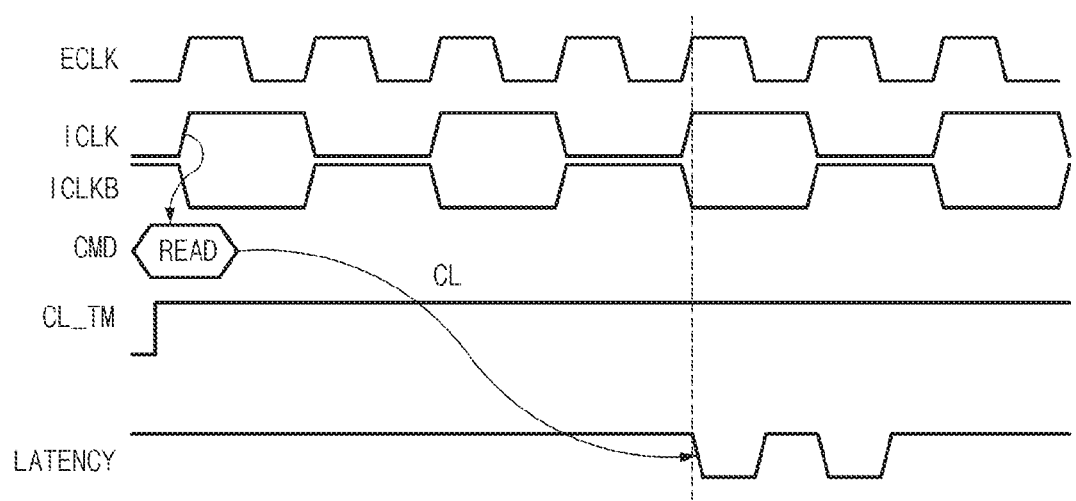
FIGS. 6 and 7 are timing diagrams illustrating representations of examples of the operation of the latency control device illustrated in FIG. 3.
Figure 7:
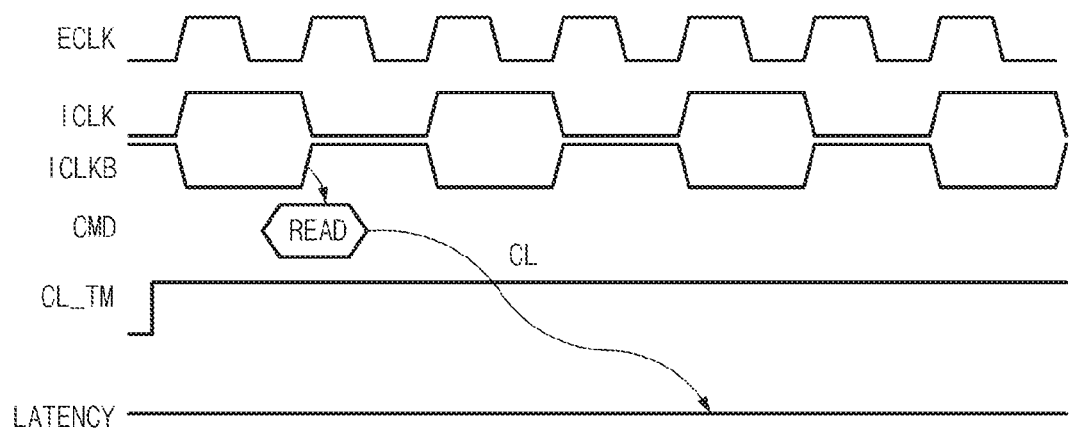

FIGS. 6 and 7 are timing diagrams illustrating representations of examples of the operation of the latency control device 300 illustrated in FIG. 3.

Upon receiving the external clock ECLK, the received external clock ECLK is divided by a half frequency such that the first internal clock ICLK and the second internal clock ICLKB are generated.

The read command READ is synchronized with the rising edge of the first internal clock ICLK and then applied to the latency control device as illustrated in FIG. 6. If the test signal CL_TM is activated, after lapse of a delay time corresponding to the CAS latency (CL) established in the latency control device 300, the latency control device may output the latency signal LATENCY.

For example, the read command READ is synchronized with the rising edge of the second internal clock ICLKB and then applied to the latency control device as illustrated in FIG. 7. If the test signal CL_TM is activated, the test control signal T_CON is applied to the second delay controller 320, such that the latency signal LATENCY is reset.

In accordance with the DLL circuit 400 of the synchronous semiconductor device, division of a clock signal is carried out to properly cope with a high-speed operation, such that a clock signal having 4 phases is used. The 4-phase clock signal is needed to guarantee the internal margin of the semiconductor device, when the external clock is divided by the divider 200 of the semiconductor device according to a request of a high-speed operation and is then operated by a half frequency.

In this case, the CAS latency (CL) circuit may operate by the divided 4-phase clock signals. Since the division operation is achieved in the semiconductor device to adjust the CAS latency, it seems that no division occurs in the outside of the semiconductor device, such that the read operation can be normally carried out.

An embodiment of the present disclosure may allow the DLL circuit 400 to control latency of the latency control device 300 during the test mode. An embodiment of the present disclosure can efficiently test various functions of the 4-phase CAS latency control circuit during the test mode.

An embodiment of the present disclosure can extract only the rising edge when the latency signal LATENCY is output, such that the internal margin or the like can be estimated on the condition that only the rising clock is received. Although the embodiments of the present disclosure, for example, have disclosed that only the rising edge is extracted for convenience of description and better understanding of the present disclosure, the scope or spirit of the present disclosure is not limited thereto, and the embodiments may also test the internal margin on the condition that only the falling clock is applied to the semiconductor device.

Figure 8:
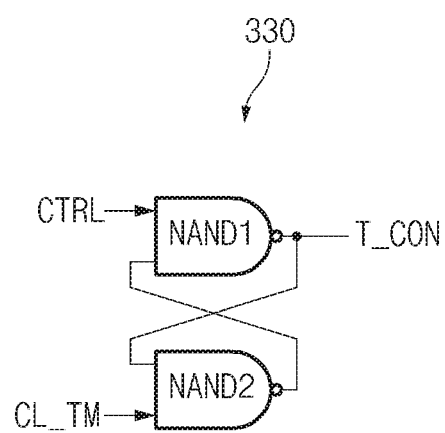
FIG. 8 is a circuit diagram illustrating a representation of an example of a test controller illustrated in FIG. 3.

FIG. 8 is a circuit diagram illustrating a representation of an example of the test controller 330 illustrated in FIG. 3.

Referring to FIG. 8, the test controller 330 may include logic gates, for example, NAND gates (NAND1, NAND2) coupled in the form of an SR-latch structure. If the control signal CTRL is activated, the test controller 330 may control the test control signal T_CON to be maintained at a logic high level. If the test signal CL_TM is reset and activated (for example, at a logic low level), the test controller 330 may control the test control signal T_CON to be reset at a logic low level.

Figure 9:
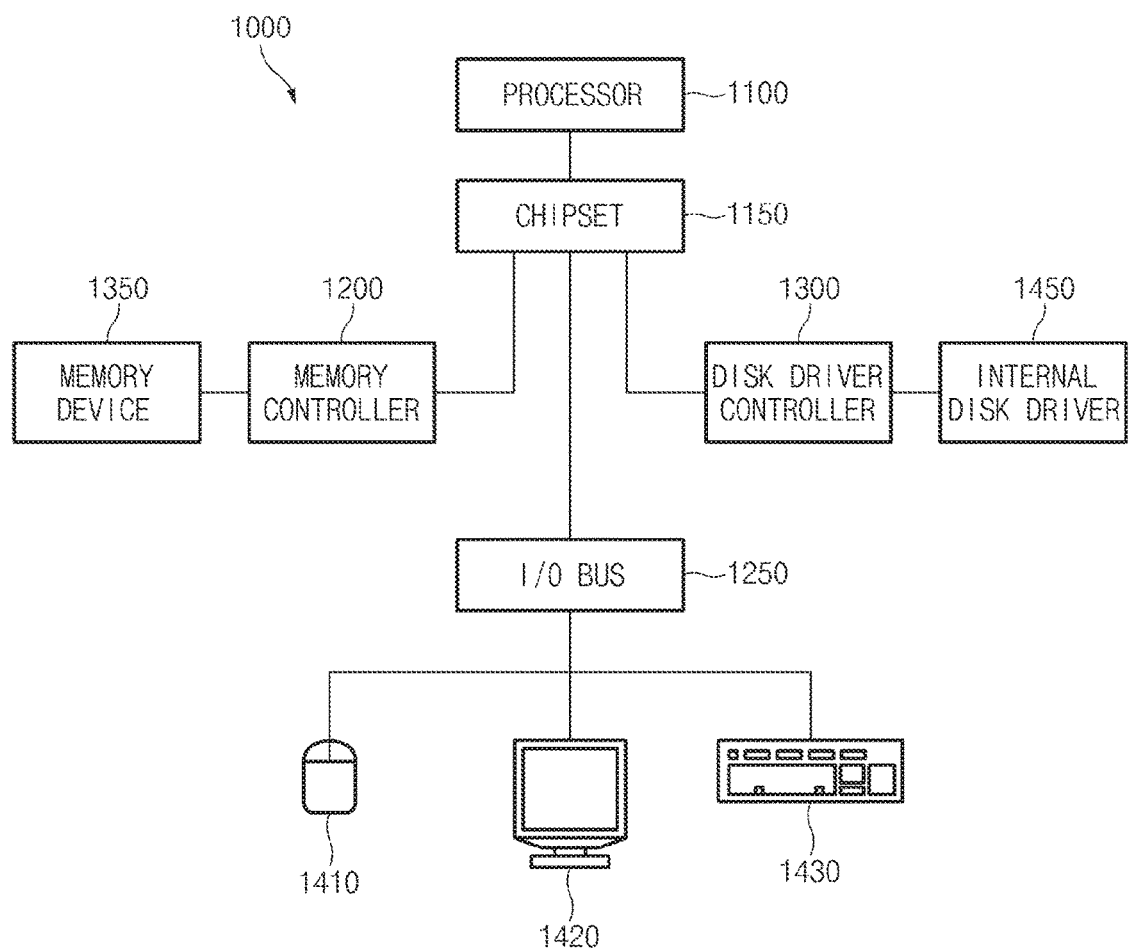
FIG. 9 illustrates a block diagram of an example of a representation of a system employing a semiconductor device.

FIG. 9 is a block diagram illustrating a representation of an example of a representation of a system employing a semiconductor device.

The semiconductor device as discussed above (see FIGS. 1-8) are particular useful in the design of memory devices, processors, and computer systems. For example, referring to FIG. 9, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one smart self-repair device and/or method of self-repairing a package as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a system 1000 employing a semiconductor device as discussed above with relation to FIGS. 1-8. In alternate embodiments, such as, for example but not limited to, cellular phones or digital cameras, the components may differ from the embodiments illustrated in FIG. 9.

As is apparent from the above description, after completion of the ECC (Error Correction Code) operation of the semiconductor memory device, the semiconductor device according to embodiments can remove data disturbance during the write operation.

As is apparent from the above description, the latency control device according to embodiments outputs a latency signal by extracting only the rising or falling edge of a clock signal in response to a test signal, thereby estimating an internal margin of the semiconductor device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A latency control device comprising:
   a first delay controller configured to delay a command signal based on a first internal clock having a first phase and a control signal;
   a second delay controller configured to delay the command signal in response to a second internal clock having a second phase different from the first phase and a test control signal;
   a selection circuit configured to select any one of an output signal of the first delay controller and an output signal of the second delay controller based on a selection signal, and output a latency signal; and
   a test controller configured to generate the test control signal based on the control signal and a test signal.

2. The latency control device according to claim 1, wherein the first delay controller includes:
   a plurality of flip-flops coupled in series, configured to operate based on the first internal clock and the command signal based on the activation of the control signal.

3. The latency control device according to claim 2, wherein each of the plurality of flip-flops include a D flip-flop.

4. The latency control device according to claim 1, wherein the first internal clock is a rising clock having a half cycle of an external clock.

5. The latency control device according to claim 1, wherein the second internal clock is a falling clock having a half cycle of an external clock.

6. The latency control device according to claim 1, wherein the second delay controller includes:
   a plurality of flip-flops coupled in series, configured to operate based on the second internal clock and the command signal based on the activation of the control signal.

7. The latency control device according to claim 6, wherein each of the plurality of flip-flops include a D flip-flop.

8. The latency control device according to claim 1, wherein the second delay controller operates based on the control signal based on the deactivation of the test signal, and is reset based on the test control signal based on the activation of the test signal.

9. The latency control device according to claim 1, wherein:
   the test controller deactivates the test control signal based on the activation of the control signal and the deactivation of the test signal, and activates the test control signal based on the activation of the test signal.

10. The latency control device according to claim 9, wherein the test controller includes:
    an SR latch configured to output the test control signal based on reception of the control signal and the test signal.

* * * * *